US012641927B2

(12) United States Patent
Wang et al.

(10) Patent No.: US 12,641,927 B2
(45) Date of Patent: May 26, 2026

(54) LIGHT-EMITTING DEVICE AND DISPLAY PANEL

(71) Applicant: XIAMEN SAN'AN OPTOELECTRONICS CO., LTD., Xiamen (CN)

(72) Inventors: Qing Wang, Xiamen (CN); Wei Li, Xiamen (CN); Minyou He, Xiamen (CN); Shiwei Liu, Xiamen (CN); Ling-yuan Hong, Xiamen (CN); Su-hui Lin, Xiamen (CN); Chung-ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 421 days.

(21) Appl. No.: 18/320,057

(22) Filed: May 18, 2023

(65) Prior Publication Data

US 2023/0290907 A1     Sep. 14, 2023

Related U.S. Application Data

(63) Continuation-in-part of application No. PCT/CN2020/130156, filed on Nov. 19, 2020.

(51) Int. Cl.
*H10H 20/841* (2025.01)
*G02F 1/13357* (2006.01)

(52) U.S. Cl.
CPC ......... *H10H 20/841* (2025.01); *G02F 1/1336* (2013.01); *G02F 2201/346* (2013.01)

(58) Field of Classification Search
CPC .. H10H 20/841; H10H 20/814; G02F 1/1336; G02F 2201/346
See application file for complete search history.

(56) References Cited

U.S. PATENT DOCUMENTS

2021/0296393 A1*    9/2021    Kang .................. H10F 39/8063

FOREIGN PATENT DOCUMENTS

CN          106206889 A        12/2016
CN          106611811 A        5/2017
                    (Continued)

OTHER PUBLICATIONS

Search Report issued to PCT application No. PCT/CN2020/130156 on Aug. 18, 2021.

*Primary Examiner* — Marlon T Fletcher
*Assistant Examiner* — Samuel Jonathan Smith
(74) *Attorney, Agent, or Firm* — MUNCY, GEISSLER, OLDS & LOWE, P.C.

(57)     ABSTRACT

A light-emitting device includes a light-emitting element including an epitaxial structure and a DBR. The DBR includes first and second reflective units. The first reflective unit includes first reflective structures. The second reflective unit includes second reflective structures. Each of the first and second reflective structures has first and second material layers. The first material layer of each of the first reflective structures has an optical thickness different from that of the first material layer of each of the second reflective structures. The second material layer of each of the first reflective structures has an optical thickness different from that of the second material layer of each of the second reflective structures. In each of the first and second reflective structures, the first material layer has a refractive index different from that of the second material layer.

20 Claims, 14 Drawing Sheets

(56) References Cited

FOREIGN PATENT DOCUMENTS

| CN | 109427936 A | 3/2019 |
| CN | 110556463 A | 12/2019 |

* cited by examiner

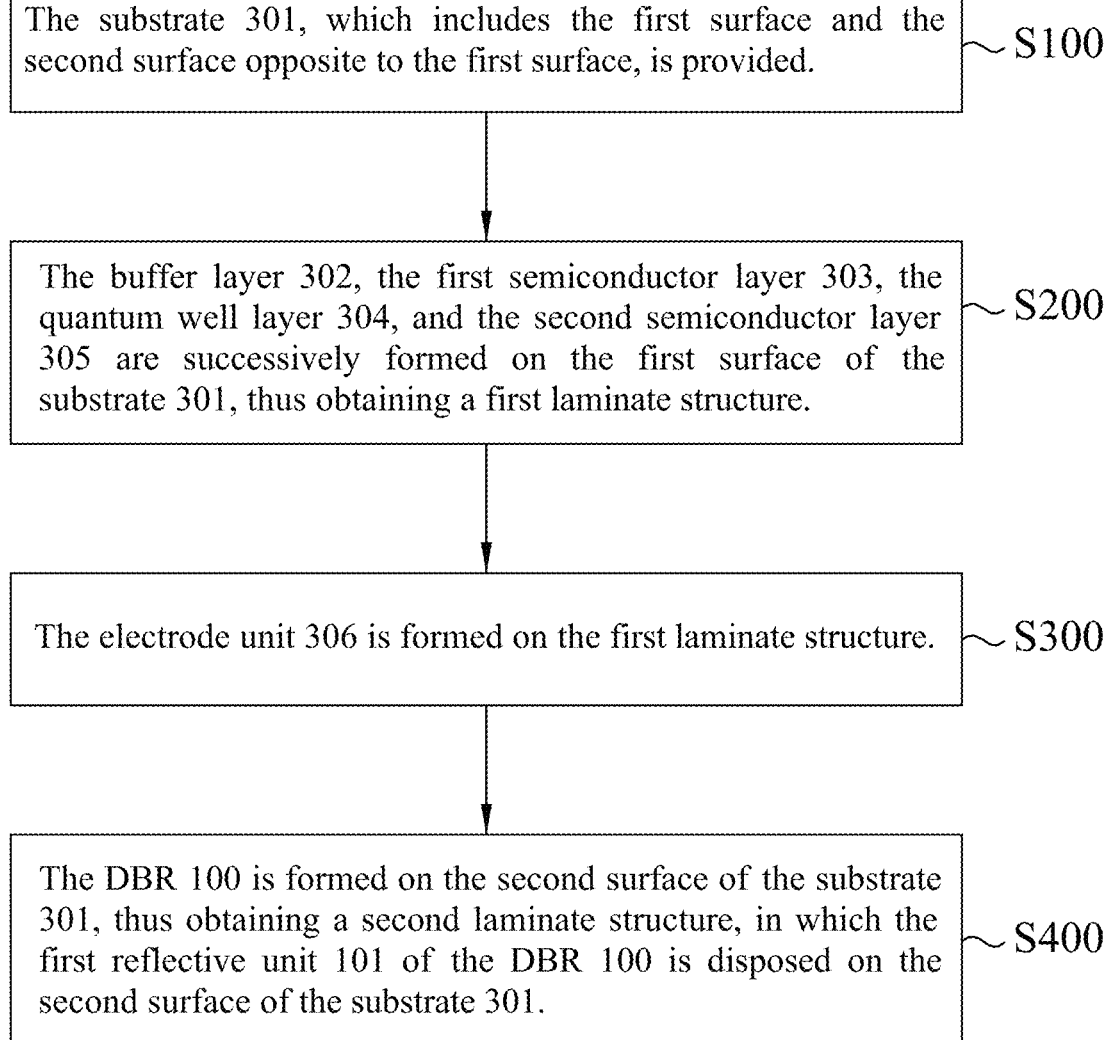

The substrate 301, which includes the first surface and the second surface opposite to the first surface, is provided. ~ S100

The buffer layer 302, the first semiconductor layer 303, the quantum well layer 304, and the second semiconductor layer 305 are successively formed on the first surface of the substrate 301, thus obtaining a first laminate structure. ~ S200

The electrode unit 306 is formed on the first laminate structure. ~ S300

The DBR 100 is formed on the second surface of the substrate 301, thus obtaining a second laminate structure, in which the first reflective unit 101 of the DBR 100 is disposed on the second surface of the substrate 301. ~ S400

LIGHT-EMITTING DEVICE AND DISPLAY PANEL

CROSS-REFERENCE TO RELATED APPLICATION

This application is a bypass continuation-in-part (CIP) application of PCT International Application No. PCT/CN2020/130156, filed on Nov. 19, 2020. The entire content of the international patent application is incorporated herein by reference.

FIELD

The disclosure relates to a light-emitting device and a display panel including the same.

BACKGROUND

Light-emitting diodes (LEDs) are used as a light source and applications thereof have been developing rapidly. Recently, mini LEDs, used as a backlight for liquid crystal displays, have been widely popular for their ability to deliver good display quality.

Flip-chip technology is used to enhance the luminous efficiency of a mini LED. The optical performance of the mini LED is determined directly by the light-emitting angle thereof, so that adjustment of the light-emitting angle is the key for improving the optical performance of the mini LED. However, adjustment of the light-emitting angle of the mini LED is one of the many technical challenges in this field.

A conventional method for adjusting the light-emitting angle of the mini LED is to dispose a distributed Bragg reflector (DBR) on a first surface of a substrate, which has an epitaxial structure disposed on a second surface thereof opposite to the first surface. Referring to FIG. 1, natural light (L1) propagating on a dielectric medium (L10) produces reflected light (L2) and refracted light (L3). In general, both the reflected light (L2) and the refracted light (L3) are partially polarized light. When the incident angle of the natural light (L1) is a Brewster's angle (denoted by $\theta_b$ in FIG. 1), the reflected light (L2) then only includes linearly polarized light (e.g., S-polarized light), and the other polarized light (e.g., P-polarized light) is transmitted into the dielectric medium (L10). Referring to FIG. 2, in a semiconductor light-emitting element, when light is emitted from an epitaxial structure 2 disposed on a substrate 1 and travels into an encapsulating layer 4 via a reflective structure 3, due to formation of the Brewster's angle, light emitted from the epitaxial structure 2 may not be completely reflected by the reflective structure 3 and may partially transmit through the reflective structure 3, so that a light leakage may occur in the semiconductor light-emitting element.

The reflective structure 3 of the above-mentioned conventional semiconductor light-emitting element is designed without consideration for the effect of the encapsulating layer 4 on the internal light reflection of the light-emitting element. This may cause a frontal light leakage of the light-emitting element, and may further cause a formation of hotspots (i.e., being uneven in brightness) in a product equipped with the light-emitting element.

SUMMARY

Therefore, an object of the disclosure is to provide a light-emitting device and a display panel that can alleviate at least one of the drawbacks of the prior art.

According to a first aspect of the disclosure, the light-emitting device includes a light-emitting element. The light-emitting element includes an epitaxial structure and a distributed Bragg reflector (DBR). The DBR of the light-emitting element includes a first reflective unit and a second reflective unit. The first reflective unit includes a plurality of first reflective structures stacked on one another. Each of the first reflective structures has a first material layer and a second material layer. The first material layers and the second material layers of the first reflective structures are alternately stacked on one another. The second reflective unit is disposed on the first reflective unit and includes a plurality of second reflective structures stacked on one another. Each of the second reflective structures has a first material layer and a second material layer. The first material layers and the second material layers of the second reflective structures are alternately stacked on one another. The first material layer of each of the first reflective structures has an optical thickness that differs from that of the first material layer of each of the second reflective structures. The second material layer of each of the first reflective structures has an optical thickness that differs from that of the second material layer of each of the second reflective structures. The first material layer of each of the first reflective structures and the second reflective structures has a refractive index that differs from that of the second material layer of each of the first reflective structures and the second reflective structures.

According to a second aspect of the disclosure, the display panel includes the aforesaid light-emitting device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 10 is a flow chart showing a method for manufacturing a light-emitting device according to the present disclosure.

DETAILED DESCRIPTION

Figure 1:
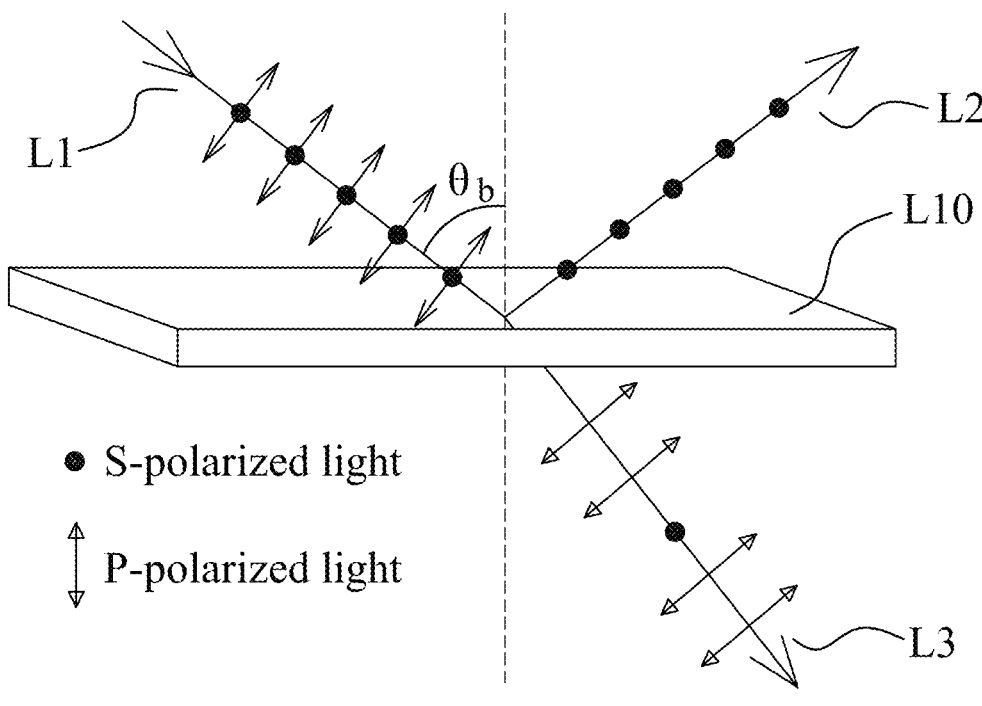
FIG. 1 is a schematic view of a light path, illustrating a polarization of reflected light in the presence of a Brewster's angle.
Figure 2:
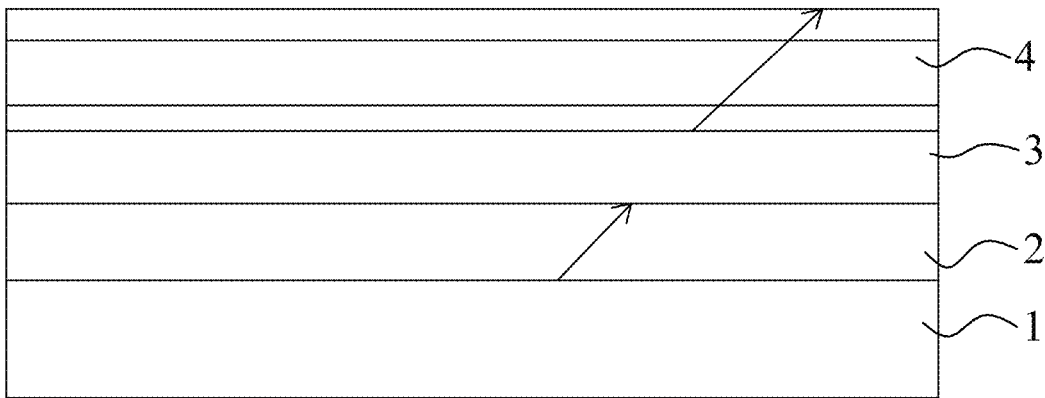
FIG. 2 is a schematic cross-sectional view illustrating a light leakage of a semiconductor light-emitting device occurred due to the presence of the Brewster's angle.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 3A:
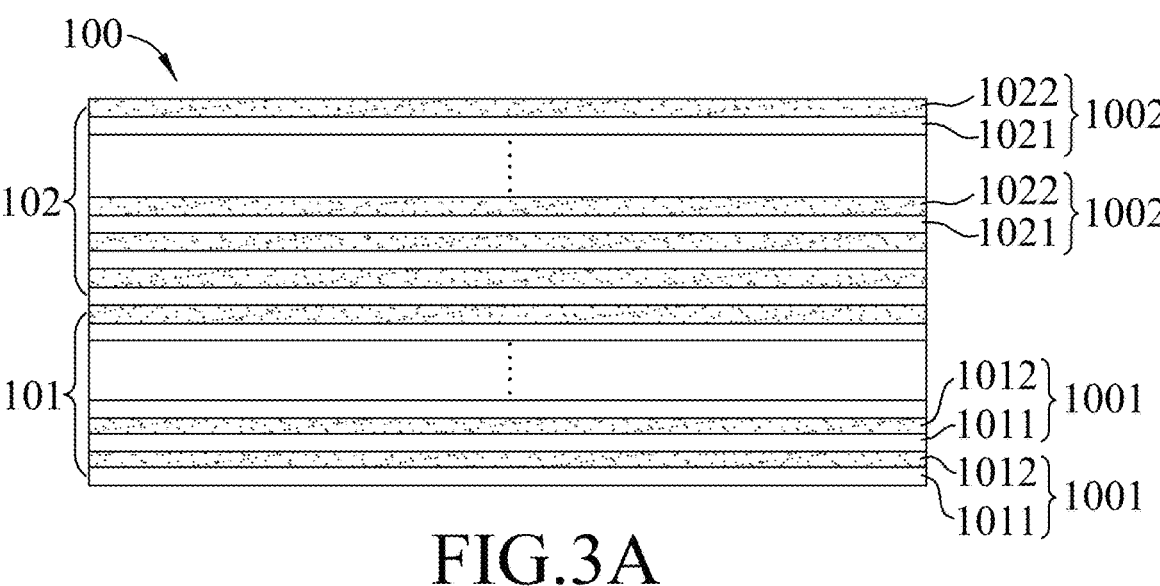
FIG. 3A is a schematic cross-sectional view of a first embodiment of a distributed Bragg reflector (DBR) according to the present disclosure.

Referring to FIG. 3A, a first embodiment of a distributed Bragg reflector (DBR) 100 according to the present disclosure is shown. The DBR 100 may be applied, along with an epitaxial structure 20, to a light-emitting element 300 of a light-emitting device 200 to be described below (see FIG. 8). The DBR 100 of this embodiment includes a first reflective unit 101 and a second reflective unit 102 disposed on the first reflective unit 101. The first reflective unit 101 includes a plurality of first reflective structures 1001 stacked on one another. Each of the first reflective structures 1001 has a first material layer 1011 and a second material layer 1012. The first material layers 1011 and the second material layers 1012 of the first reflective structures 1001 are alternately stacked on one another. The second reflective unit 102 includes a plurality of second reflective structures 1002 stacked on one another. Each of the second reflective structures 1002 has a first material layer 1021 and a second material layer 1022. The first material layers 1021 and the second material layers 1022 of the second reflective structures 1002 are alternately stacked on one another. The first material layer 1011, 1021 of each of the first reflective structures 1001 and the second reflective structures 1002 has a refractive index that differs from that of the second material layer 1012, 1022 of each of the first reflective structures 1001 and the second reflective structures 1002. The first material layer 1011 of each of the first reflective structures 1001 has an optical thickness that differs from that of the first material layer 1021 of each of the second reflective structures 1002. The second material layer 1012 of each of the first reflective structures 1001 has an optical thickness that differs from that of the second material layer 1022 of each of the second reflective structures 1002.

In some embodiments, in the first reflective structures 1001 and the second reflective structures 1002, each of the first material layers 1011, 1021 has a refractive index less than that of each of the second material layers 1012, 1022. For example, in the first reflective structures 1001 and the second reflective structures 1002, each of the first material layers 1011, 1021 is a silicon dioxide ($SiO_2$) layer that has a refractive index ranging between 1.4 and 1.5, and each of the second material layers 1012, 1022 is a titan dioxide ($TiO_2$) layer that has a refractive index of 2.42. In some embodiments, in the second reflective unit 102, the sum of the optical thicknesses of the first material layers 1021 is greater than the sum of the optical thicknesses of the second material layers 1022.

The quantity of the first reflective structures 1001 of the first reflective unit 101 and the quantity of the second reflective structures 1002 of the second reflective unit 102 may be the same or different, and may be adjusted according to a wavelength of light to be emitted from the epitaxial structure 20 of the light-emitting element 300. In some embodiments, the quantity of each of the first reflective structures 1001 and the second reflective structures 1002 ranges between 6 and 19. In the first reflective unit 101 and the second reflective unit 102, the optical thickness of each of the first material layers 1011, 1021 and the second material layers 1012, 1022 may be adjusted according to the desired physical thickness and refractive index thereof. In some embodiments, in the first reflective structures 1001 and the second reflective structures 1002, each of the first material layers 1011, 1021 and the second material layers 1012, 1022 has an optical thickness greater than $\lambda_0/4$, where 420 nm$\leq\lambda_0\leq$470 nm. In some embodiments, in the first reflective structures 1001, each of the first material layers 1011 and the second material layers 1012 has an optical thickness substantially equal to $\lambda_1/4$, where $\lambda_1\leq$550 nm. In some embodiments, in the second reflective structures 1002, each of the first material layers 1021 has an optical thickness different from that of each of the second material layers 1022. In some embodiments, in the second reflective structures 1002, each of the first material layers 1021 has an optical thickness substantially equal to $\lambda_2/4$, where $\lambda_2\leq$900 nm, and each of the second material layers 1022 has an optical thickness substantially equal to $\lambda_3/4$, where $\lambda_3\leq$700 nm.

When the DBR 100 is applied to the light-emitting element 300, the first reflective unit 101 may be disposed on a light-emitting surface of the epitaxial structure 20 for reflecting light emitted from the epitaxial structure 20. However, due to Brewster's law, a large amount of incident light having the incident angle ranging between 33° and 55° will be transmitted through the DBR 100. In this embodiment, by virtue of the second reflective unit 102, the transmission of light having the incident angle ranging between 33° and 55° may be reduced. As such, according to this embodiment, the light emission emitted from the light-emitting element 300 at the incident angle ranging between 33° and 55° may be reduced, so that a frontal light leakage of the light-emitting element 300 may be reduced, thereby enhancing the displaying effect of the light-emitting element 300

Figure 3B:
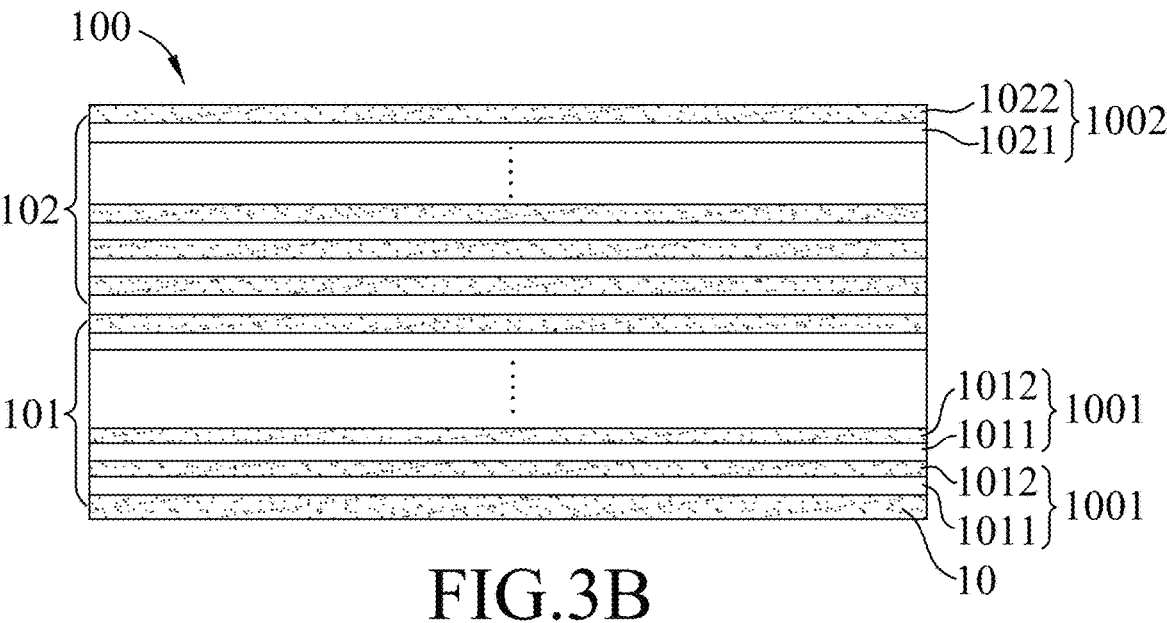
FIG. 3B is a schematic cross-sectional view of a second embodiment of the DBR according to the present disclosure.

Referring to FIG. 3B, a second embodiment of the DBR 100 according to the present disclosure is shown. The DBR 100 of the second embodiment is similar to that of the first embodiment, except for that, in the second embodiment, the DBR 100 further includes a third material layer 10 that is disposed on the first reflective unit 101 opposite to the second reflective unit 102.

In some embodiments, the topmost layer of the DBR 100 is the second material layer 1022 of the second reflective structure 1002, and the bottommost layer of the DBR 100 is the third material layer 10. The third material layer 10 is disposed for preventing chipping at edges of the light-emitting element 300, which may be caused by dicing during manufacturing of the light-emitting device 200, thus improving the yield of the light-emitting device 200. Since the topmost layer of the DBR 100 is the second material layer 1022 of the second reflective structure 1002, there is a difference in the refractive index between the topmost layer of the DBR 100 and an encapsulating layer 400 of the light-emitting device 200, so that the transmittance of the light may be reduced, thereby enhancing the optical performance of the light-emitting device 200. In some embodiments, the first reflective unit 101 includes at least three of the first reflective structures 1001, and a variation in the optical thickness among the first material layers 1011 of the first reflective structures 1001 is within 30 nm. In some embodiments, the first reflective unit 101 includes at least three of the first reflective structures 1001, and a variation of the optical thickness among the second material layers 1012 is within 30 nm.

In some embodiments, the second reflective unit 102 includes at least three of the second reflective structures 1002. The first material layer 1021 of one of the second reflective structures 1002 has an optical thickness no greater than 135 nm; the first material layer 1021 of one of the second reflective structures 1002 has an optical thickness no smaller than 175 nm; and the second material layer 1022 of one of the second reflective structures 1002 has an optical thickness no greater than 135 nm. In some embodiments, in the second reflective unit 102, a difference in the optical thickness between one of the first material layers 1021 having the greatest optical thickness and one of the first material layers 1021 having the least optical thickness is no smaller than 60 nm. In order to prevent the DBR 100 from breaking caused by the first material layers 1021 of the second reflective unit 102 being too thick, which may cause malfunction of the DBR 100, in some embodiments, in the second reflective unit 102, a difference in the optical thickness between one of the first material layers 1021 having the greatest optical thickness and one of the first material layers 1021 having the least optical thickness ranges between 60 nm and 120 nm. By virtue of such configuration, when the first material layer 1021 of each of the second reflective structures 1002 is a $SiO_2$ layer, the DBR 100 may further be prevented from breaking. In some embodiments, in the second reflective unit 102, a difference in the optical thickness between one of the second material layers 1022 having the greatest optical thickness and one of the second material layers 1022 having the least optical thickness is no smaller than 30 nm. In some embodiments, in the second reflective unit 102, a difference in the optical thickness between one of the second material layers 1022 having the greatest optical thickness and one of the second material layers 1022 having the least optical thickness ranges between 30 nm and 70 nm. In some embodiments, the greatest difference among differences in the optical thicknesses of the first material layers 1011 of the first reflective unit 101 and differences in the optical thicknesses of the second material layers 1012 of the first reflective unit 101 is less than the greatest difference among differences in the optical thicknesses of the first material layers 1021 of the second reflective unit 102 and differences in the optical thicknesses of the second material layers 1022 of the second reflective unit 102.

Figure 4A:
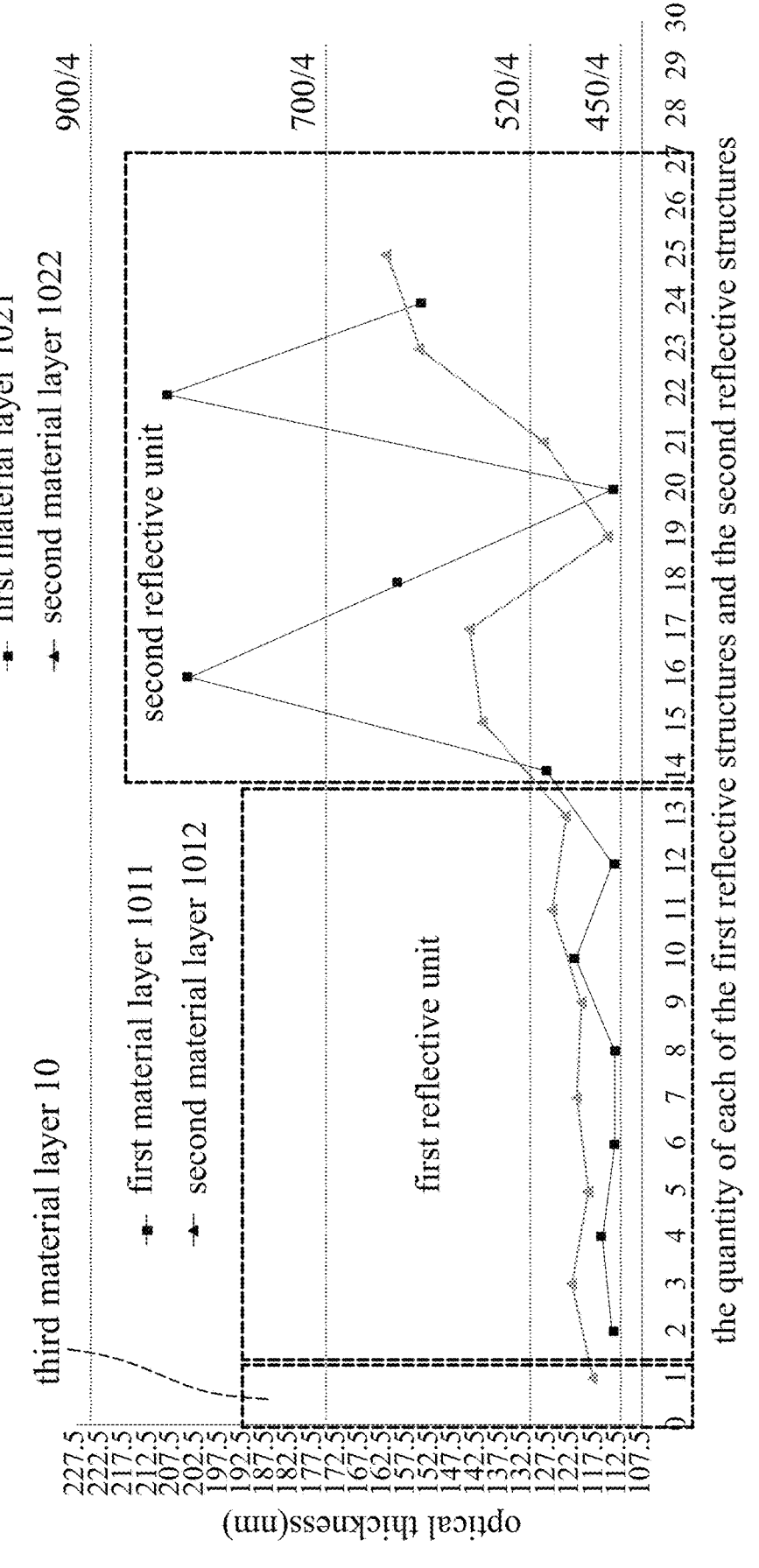
FIG. 4A is a line graph illustrating the quantities and the optical thicknesses of first material layers and second material layers of a first reflective unit and a second reflective unit in an example of the DBR according to the second embodiment.
Figure 4B:
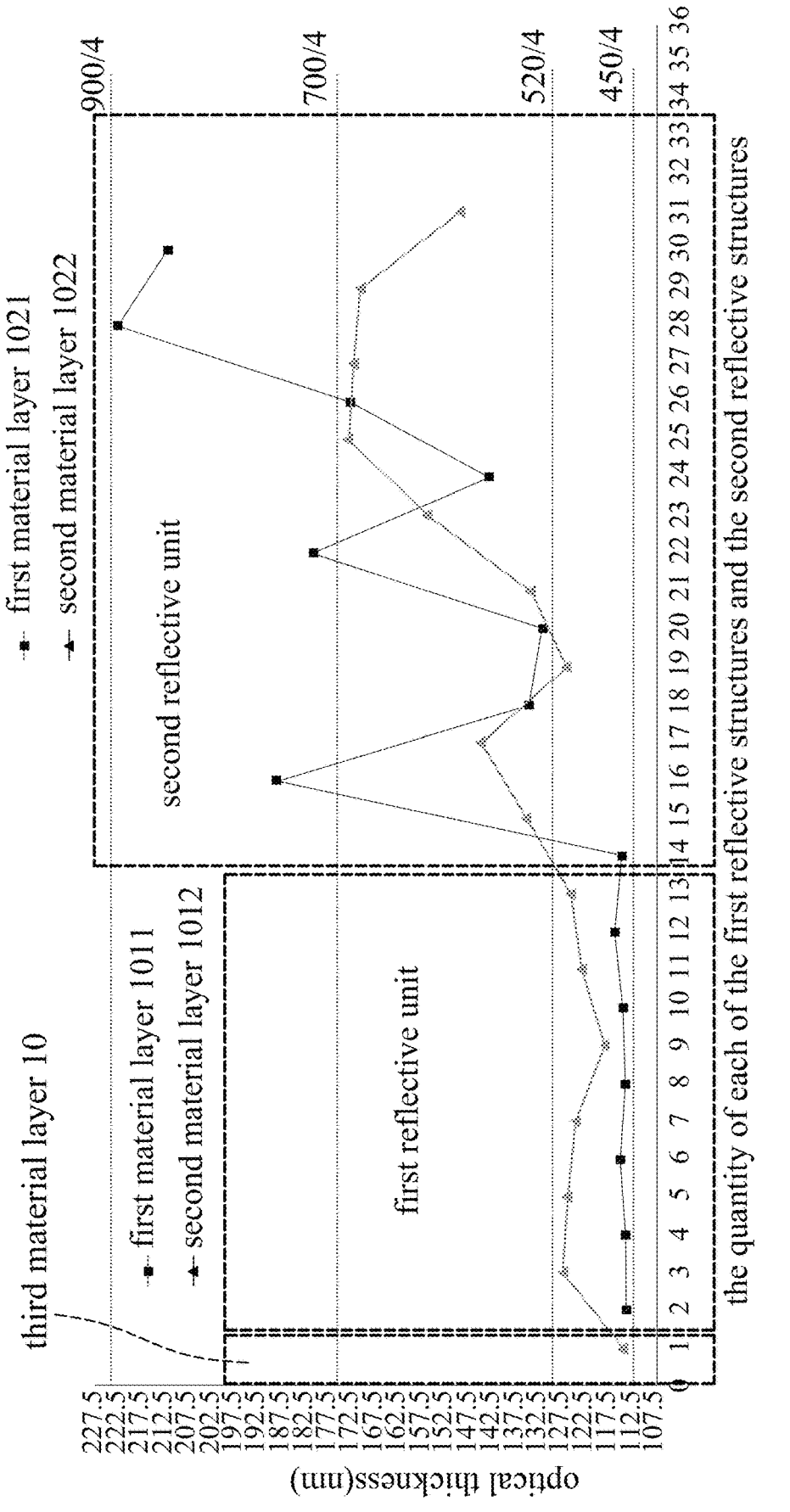
FIG. 4B is a line graph illustrating the quantity and the optical thicknesses of first material layers and second material layers of a first reflective unit and a second reflective unit in another example of the DBR according to the second embodiment.
Figure 4C:
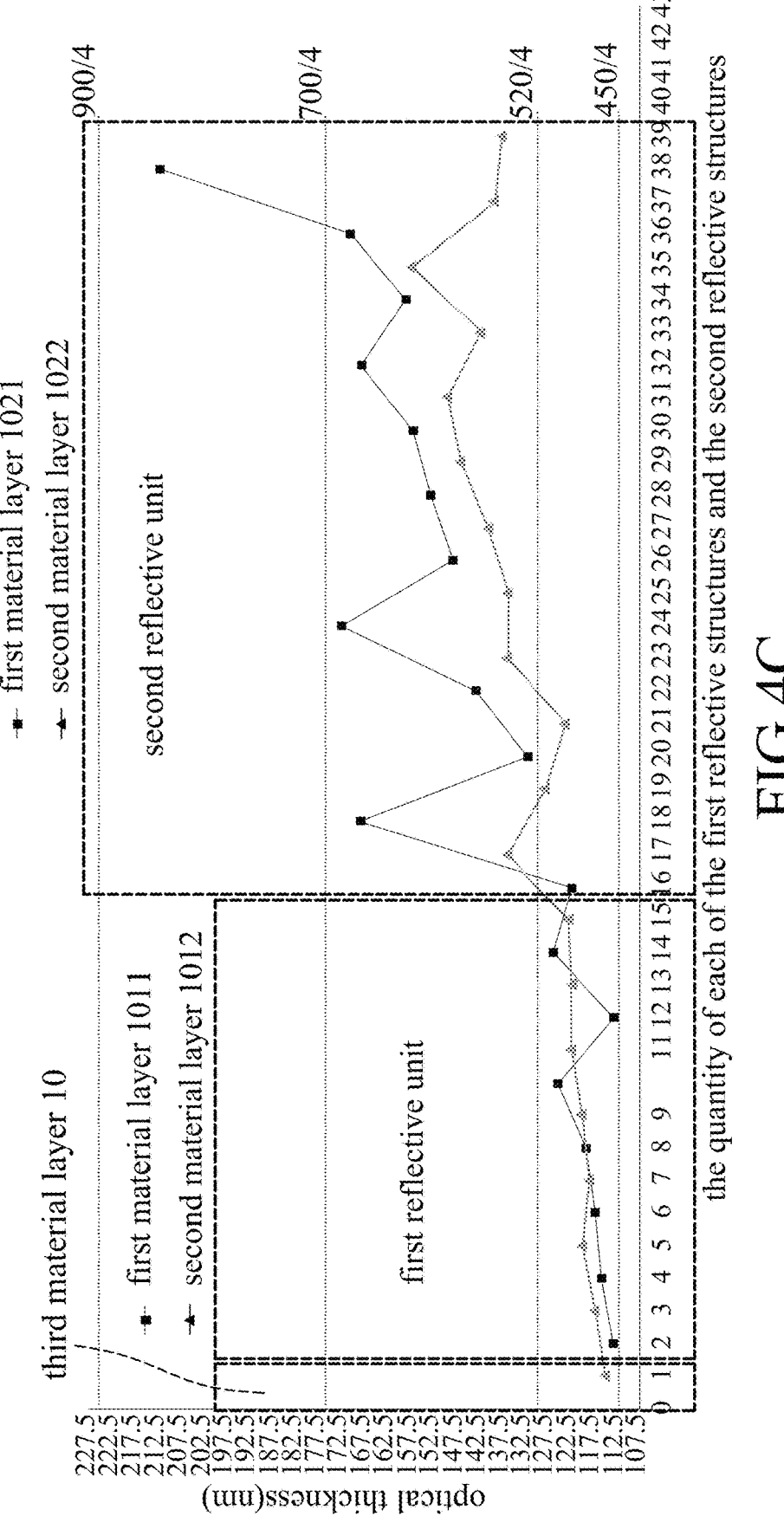
FIG. 4C is a line graph illustrating the quantity and the optical thicknesses of first material layers and second material layers of a first reflective unit and a second reflective unit in yet another example of the DBR according to the second embodiment.

Referring to FIG. 4A, an example of the DBR 100 according to the second embodiment is shown to include the third material layer 10, the first reflective unit 101, and the second reflective unit 102. The first reflective unit 101 includes six of the first reflective structures 1001, and each of the first reflective structures 1001 includes the first material layer 1011 and the second material layer 1012. The second reflective unit 102 includes six of the second reflective structures 1002, and each of the second reflective structures 1002 includes the first material layer 1021 and the second material layer 1022. Referring to FIG. 4B, another example of the DBR 100 according to the second embodiment is shown. The main difference between the DBR 100 shown in FIG. 4B and the DBR 100 shown in FIG. 4A resides in that, in the DBR 100 shown in FIG. 4B, the second reflective unit 102 includes nine of the second reflective structures 1002, and the optical thickness of each of the first material layers 1011, 1021 and the second material layers 1012, 1021 are modified as shown in FIG. 4B. Referring to FIG. 4C, a yet another example of the DBR 100 according to the second embodiment is shown. The main difference between the DBR 100 shown in FIG. 4C and the DBR 100 shown in FIG. 4A resides in that, in the DBR 100 shown in FIG. 4C, the first reflective unit 101 includes seven of the first reflective structures 1001, the second reflective unit 102 includes twelve of the second reflective structures 1002, and the optical thickness of each of the first material layers 1011, 1021 and the second material layers 1012, 1021 are modified as shown in FIG. 4C.

As seen from FIGS. 4A to 4C, in each of the examples of the DBR 100, the optical thickness of each of the first material layers 1011 of the first reflective unit 101 is different from that of each of the first material layers 1021 of the second reflective unit 102. In addition, the optical thickness of each of the first material layers 1011 and the optical thickness of each of the second material layers 1012 of the first reflective unit 101 are both greater than $\lambda_0/4$, where 420 nm$\leq\lambda_0\leq$470 nm, and the optical thickness of each of the first material layers 1021 and the optical thickness of each of the second material layers 1022 of the second reflective unit 102 are both greater than $\lambda_0/4$, where 420 nm$\leq\lambda_0\leq$470 nm. Specifically, in the first reflective unit 101, the optical thickness of each of the first material layers 1011 and the optical thickness of each of the second material layers 1012 range between a quarter of 420 nm and a quarter of 550 nm, and in the second reflective unit 102, the optical thickness of each of the first material layers 1021 ranges between a quarter of 420 nm and a quarter of 900 nm, while the optical thickness of each of the second material layers 1022 ranges between a quarter of 420 nm and a quarter of 700 nm. It should be noted that, in each of the examples of the DBR 100, the specific optical thicknesses of each of the first material layers 1011, 1021 and each of the second material layers 1012, 1022 are different, and may be comprehensively adjusted according to various factors such as the quantity, physical thickness, and refractive index of each of the first material layers 1011, 1021 and the second material layers 1012, 1022, and wavelength of light to be emitted from the light-emitting element 300.

Figure 5A:
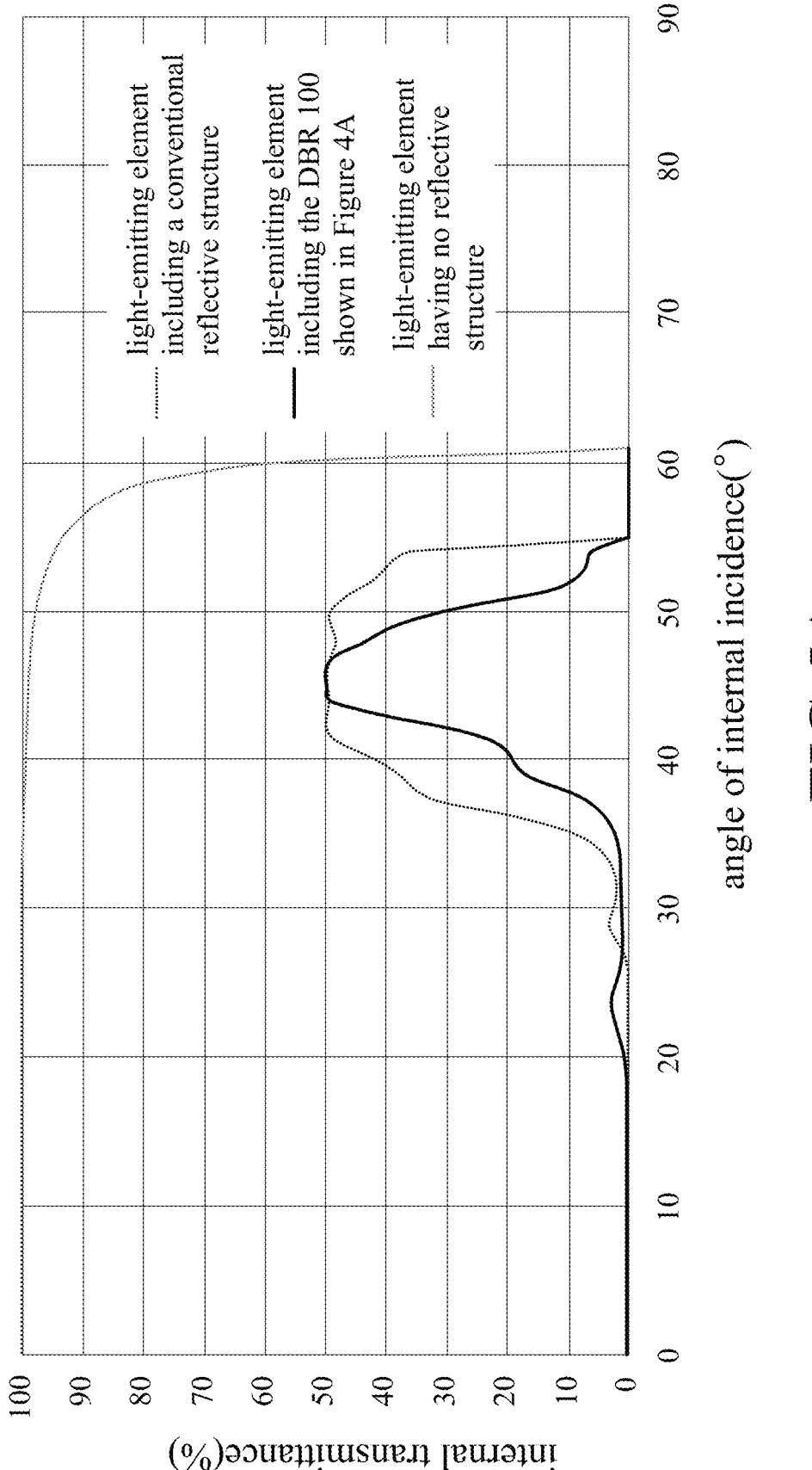
FIG. 5A is a curve graph describing relationship between the internal transmittance and the angle of internal incidence of each of a light-emitting element including the DBR shown in FIG. 4A, a light-emitting element including a conventional reflective structure, and a light-emitting element having no reflective structure.

FIG. 5A shows relationship between the internal transmittance and the angle of internal incidence of each of a light-emitting element including the DBR 100 shown in FIG. 4A, a light-emitting element including a conventional reflective structure, and a light-emitting element having no reflective structure. Each of the light-emitting elements emits light having a wavelength of 450 nm. The conventional reflective structure includes a first reflective unit including six first reflecting structures stacked on one another, and a second reflective unit disposed on the first reflective unit and including six second reflective structures stacked on one another. Each of the first reflective structures and the second reflective structures includes a first material layer (e.g., a $TiO_2$ layer) and a second material layer (e.g., a $SiO_2$ layer) disposed on the first material layer. The first material layer of each of the first reflective structures has a refractive index that differs from that of the second material layer of each of the first reflective structures. The first material layer of each of the first reflective structures has an optical thickness that differs from that of the first material layer of each of the second reflective structures, and the second material layer of each of the first reflective structures has an optical thickness that differs from that of the second material layer of each of the second reflective structures. In each of the first reflective structures, the optical thickness of the first material layer is 41.2 nm, and the optical thickness of the second material layer is 69.5 nm. In each of the second reflective structures, the optical thickness of the first material layer is 50.5 nm, and the optical thickness of the second material layer is 85.2 nm.

As seen from FIG. 5A, compared to the light-emitting element having no reflective structure, the light-emitting element including the conventional reflective structure has a relatively low internal transmittance, which means that the conventional reflective structure is capable of reducing light leakage of the light-emitting element. However, even though the light-emitting element includes the conventional reflective structure, when the incident angle ranges between 35° and 55°, the internal transmittance of the light-emitting element may still reach about 50%. Meanwhile, the light-emitting element including the DBR 100 shown in FIG. 4A has an internal transmittance significantly lower than that of the light-emitting element including the conventional reflective structure, especially when the incident angle ranges between 35° and 40°, or between 50° and 55°. Accordingly, compared to the light-emitting element having no reflective structure and the light-emitting element including the conventional reflective structure, the light-emitting element including the DBR 100 of the present disclosure may significantly reduce frontal light leakage of the light-emitting element.

Figure 5B:
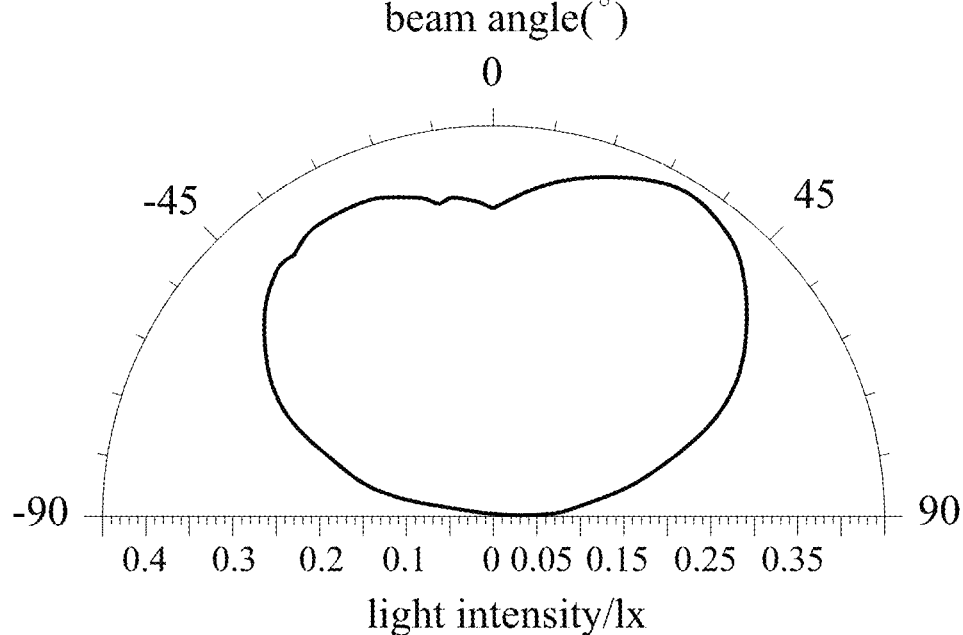
FIG. 5B is a polar diagram illustrating a light intensity distribution of the light-emitting element having no reflective structure.
Figure 5C:
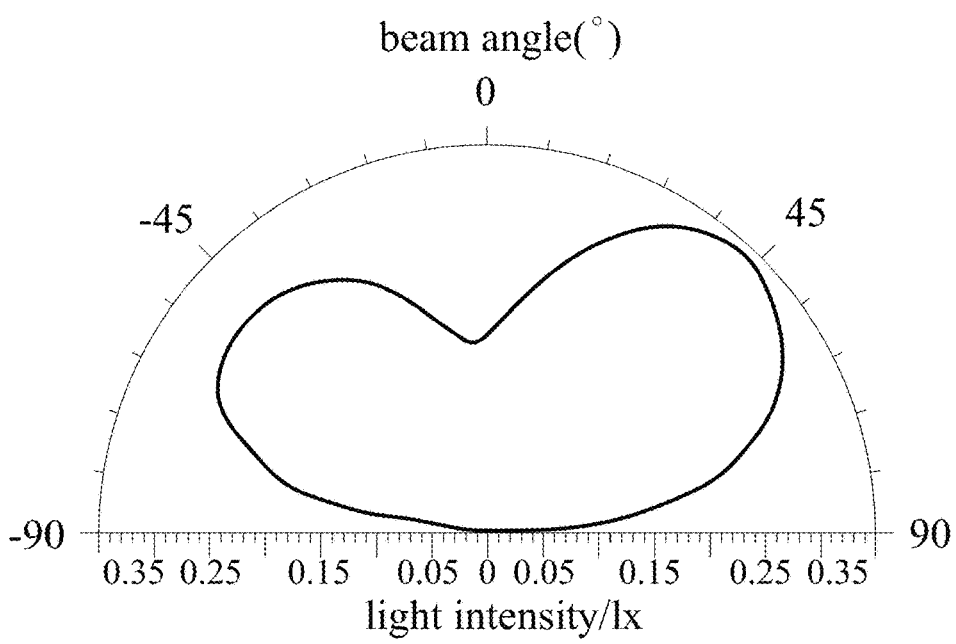
FIG. 5C is a polar diagram illustrating a light intensity distribution of the light-emitting element including the conventional reflective structure.
Figure 5D:
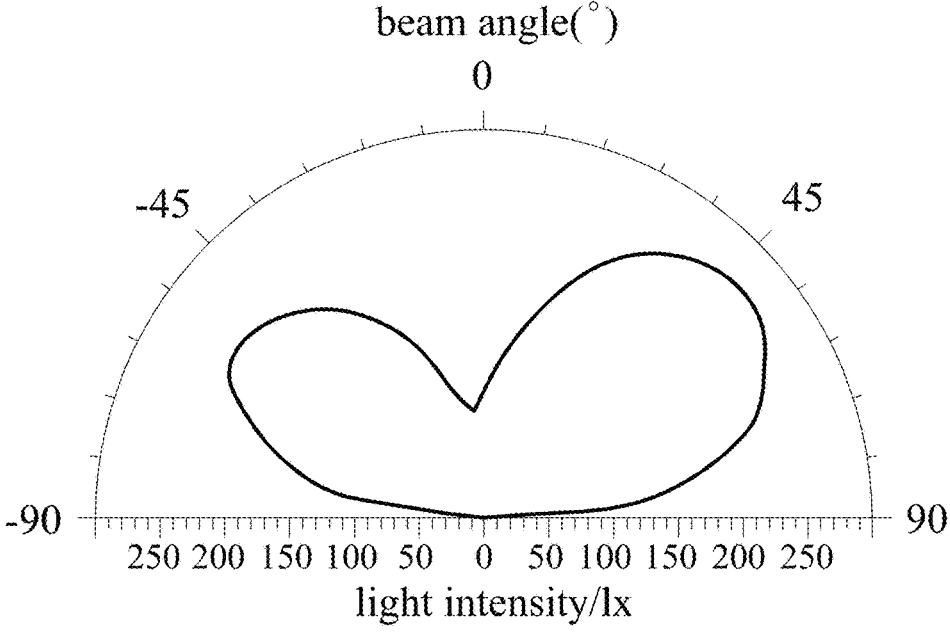
FIG. 5D is a polar diagram illustrating a light intensity distribution of the light-emitting element according to the present disclosure.

Referring to FIG. 5B, which is a polar diagram illustrating a light intensity distribution of the light-emitting element having no reflective structure, the beam angle of the light emitted by the light-emitting element having no reflective structure ranges approximately from 130° to 140°, and there is a large amount of light emission between 35° and 55°. Referring to FIG. 5C, which is a polar diagram illustrating a light intensity distribution of the light-emitting element including the conventional reflective structure, the beam angle of the light emitted by the light-emitting element including the conventional reflective structure ranges approximately from 150° to 160°, and there is a small amount of light emission between 35° and 55°. Referring to FIG. 5D, the beam angle of the light emitted by the light-emitting element including the DBR 100 shown in FIG. 4A ranges from 160° to 170°, and there is an even smaller amount of light emission between 35° and 55°. This shows that, compared to the light-emitting element having no reflective structure and the light-emitting element including the conventional reflective structure, the light-emitting element including the DBR 100 of the present disclosure may significantly reduce frontal light leakage of the light-emitting element, thereby improving the display quality of a display panel when the display panel includes the light-emitting device according to the present disclosure.

Figure 6:
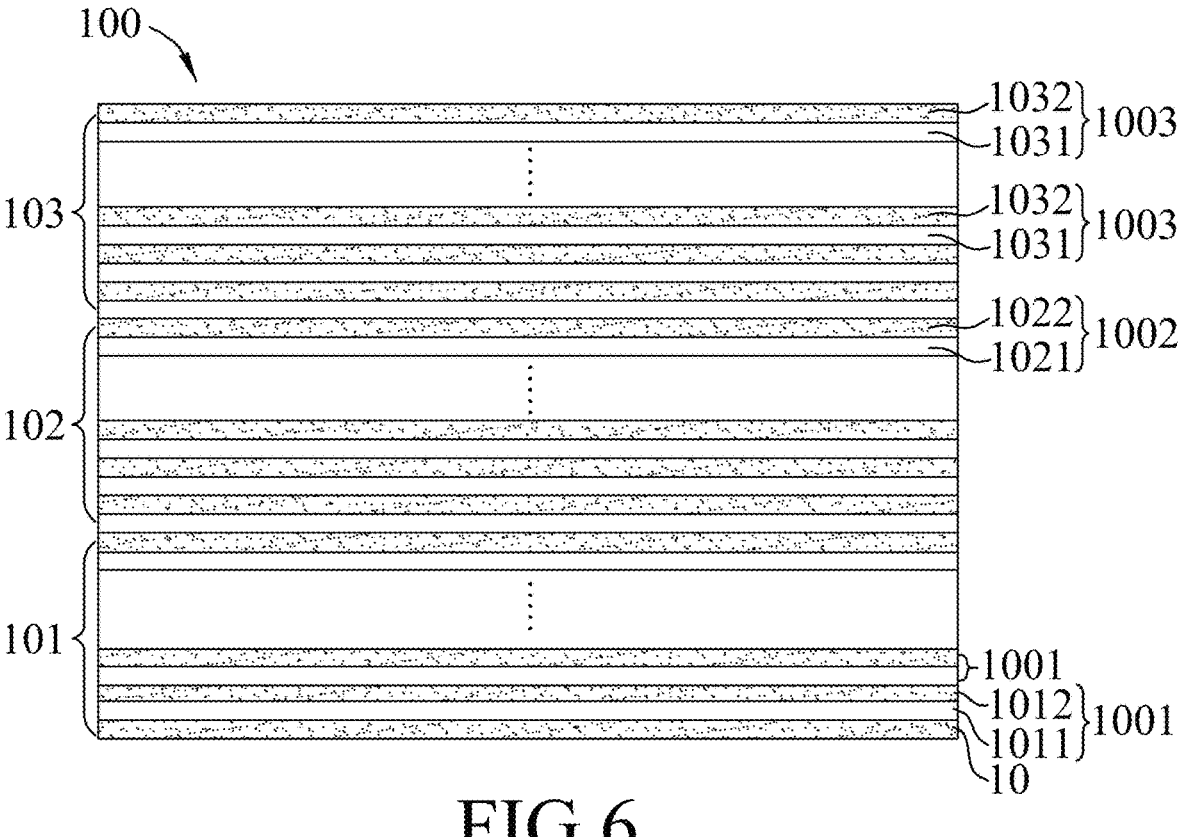
FIG. 6 is a schematic diagram of a third embodiment of the DBR according to the present disclosure.

Referring to FIG. 6, a third embodiment of the DBR 100 according to the present disclosure is shown. The DBR 100 of the third embodiment is similar to that of the second embodiment, except for that, in the third embodiment, the DBR 100 further includes a third reflective unit 103 that is disposed on the second reflective unit 102 opposite to the first reflective unit 101. The third reflective unit 103 includes a plurality of third reflective structures 1003 stacked on one another. Each of the third reflective structures 1003 has a first material layer 1031 and a second material layer 1032 that are stacked on one another. In each of the third reflective structures 1003, the first material layer 1031 has a refractive index that differs from that of the second material layer 1032.

In the DBR 100 of the third embodiment, the first reflective unit 101 may maximize an internal light reflection in the light-emitting element, the second reflective unit 102 has a low transmittance for light having an incident angle ranging between 33° and 55°, and the third reflective unit 103 may absorb light having an incident angle ranging between 33° and 55°, thereby reducing frontal light leakage of the light-emitting element.

Figure 7:
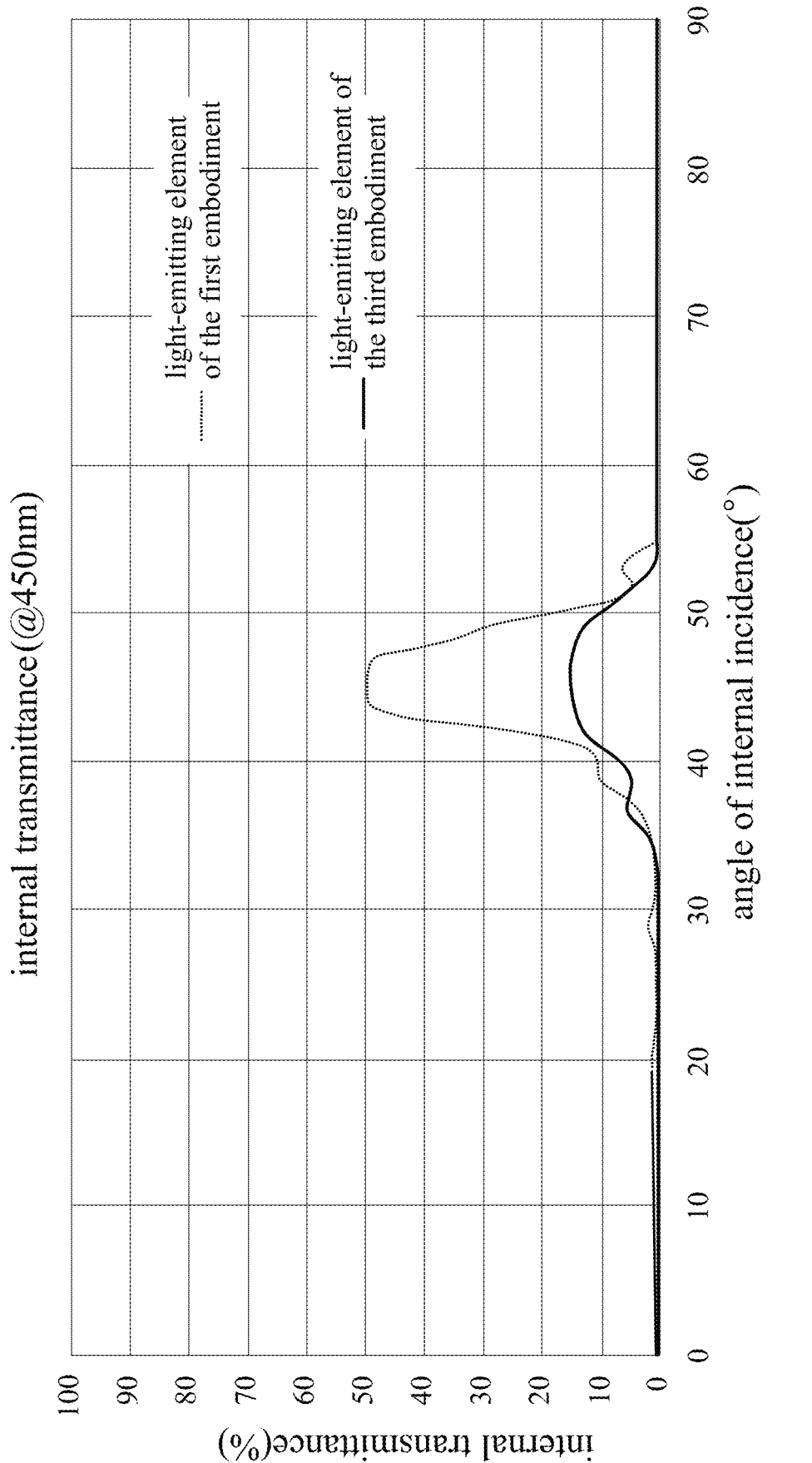
FIG. 7 is a curve graph describing relationship between the internal transmittance and the angle of internal incidence of each of the light-emitting element including the DBR of the first embodiment, and the light-emitting element including the DBR of the third embodiment according to the present disclosure.

Referring to FIG. 7, when the incident angle ranges between 40° and 50°, the internal transmittance of the light-emitting element that includes the DBR 100 of the first embodiment is about 50%, and the internal transmittance of the light-emitting element that includes the DBR 100 of the third embodiment is about 15%. This shows that, by virtue of the third reflective unit 103, the internal transmittance of the light-emitting element may further be reduced, thereby reducing frontal light leakage of the light-emitting device.

In some embodiments, in each of the third reflective structures 1003, the first material layer 1031 has a refractive index less than that of the second material layer 1032. In some embodiments, each of the first material layer 1031 and the second material layer 1032 of each of the third reflective structures 1003 is an oxide layer such as a $SiO_2$ layer or a $TiO_2$ layer. For example, in each of the third reflective structures 1003, the first material layer 1031 may be a $SiO_2$ layer that has a refractive index ranging between 1.4 and 1.5, and the second material layer 1032 may be a $TiO_2$ layer that has a refractive index greater than that of the first material layer 1031.

In some embodiments, the second material layer 1032 of each of the third reflective structures 1003 has an oxygen content different from that of the second material layer 1012, 1022 of each of the first reflective structures 1001 and second reflective structures 1002. In some embodiments, the second material layer 1032 of each of the third reflective structures 1003 has an oxygen content less than that of the second material layer 1012, 1022 of each of the first reflective structures 1001 and the second reflective structures 1002. For example, the second material layer 1012, 1022 of each of the first reflective structures 1001 and the second reflective structures 1002 may include a TiO$_2$ layer, while the second material layer 1032 of each of the third reflective structures 1003 may include a TiO$_n$ layer, where n ranges between 1.7 and 1.95. By virtue of such configuration, the third reflective unit 103 may absorb light having an incident angle ranging between 33° and 55°, so as to effectively reduce frontal light leakage of the light-emitting element even more.

The quantity of the first reflective structures 1001 of the first reflective unit 101, the quantity of the second reflective structures 1002 of the second reflective unit 102, and the quantity of the third reflective structures 1003 of the third reflective unit 103 may be the same or different, and may be adjusted according to a wavelength of light to be emitted from the epitaxial structure 20 of the light-emitting element 300, the materials of the first reflective structures 1001, the materials of the second reflective structures 1002, and the materials of the third reflective structures 1003. In some embodiments, the quantity of each of the first reflective structures 1001 of the first reflective unit 101, the second reflective structures 1002 of the second reflective unit 102, and the third reflective structures 1003 of the third reflective unit 103 ranges between 3 and 15.

In some embodiments, in each of the third reflective structures 1003, the physical thickness of the first material layer 1031 ranges between 70 nm and 150 nm, and the physical thickness of the second material layer 1032 ranges between 35 nm and 70 nm.

Figure 8:
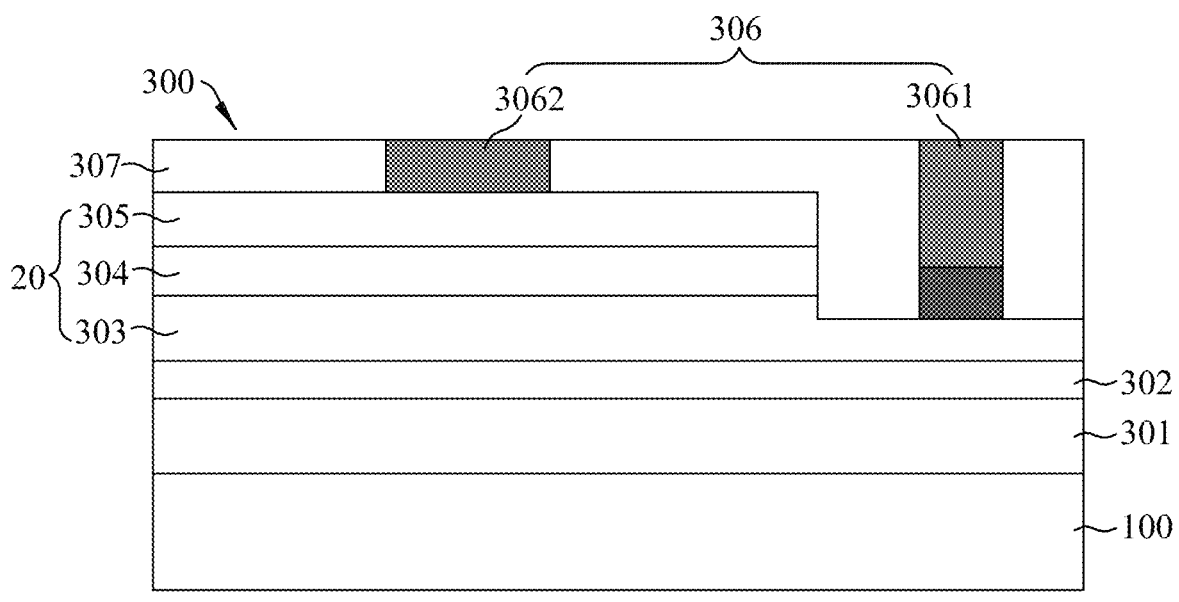
FIG. 8 is a schematic cross-sectional view of the light-emitting element according to the present disclosure.

Referring to FIG. 8, an embodiment of the light-emitting element 300 according to the present disclosure is shown. The light-emitting element 300 includes a substrate 301, a buffer layer 302, an epitaxial structure 20, a distributed Bragg reflector (DBR) 100, an electrode unit 306, and an insulating protective layer 307.

The substrate 301 has a first surface and a second surface that is opposite to the first surface. The epitaxial structure 20 includes a first semiconductor layer 303 disposed on the first surface of the substrate 301, a quantum well layer 304 disposed on the first semiconductor layer 303, and a second semiconductor layer 305 disposed on the quantum well layer 304. When the epitaxial structure 20 is a gallium nitride (GaN) type epitaxial structure, the first semiconductor layer 303 is an n-type GaN layer, and the second semiconductor layer 305 is a p-type GaN layer.

The buffer layer 302 is disposed between the first surface of the substrate 301 and the first semiconductor layer 303 of the epitaxial structure 20.

The DBR 100 may be any one of the aforementioned embodiments of the DBR 100, and thus is not to be described again. The first material layer 1011 of the first reflective unit 101 of the DBR 100 is disposed on the second surface of the substrate 301.

The electrode unit 306 includes a first electrode 3061 and a second electrode 3062 connected to the first semiconductor layer 303 and the second semiconductor layer 305 of the epitaxial structure 20, respectively.

The insulating protective layer 307 covers the epitaxial structure 20 but exposes the electrode unit 306.

Figure 9:
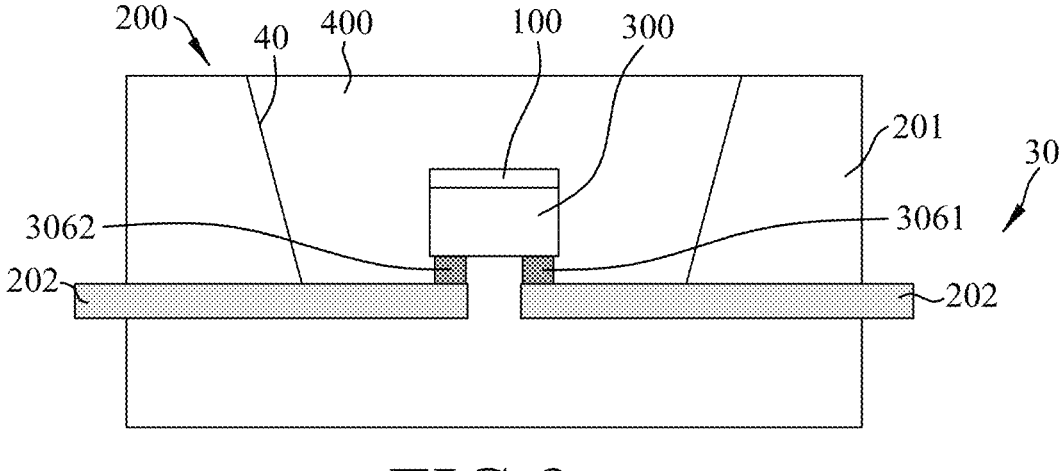
FIG. 9 is a schematic cross-sectional view of the light-emitting device according to the present disclosure.

Referring to FIG. 9, an embodiment of the light-emitting device 200 according to the present disclosure is shown. The light-emitting device 200 includes a package frame 201, a light-emitting element 300, an electrode set 30, and an encapsulating layer 400.

The package frame 201 may be any frame suitable for mounting and fixing the light-emitting element 300. The package frame 201 defines a die bonding area 40 allowing the light-emitting element 300 to be disposed therein. In this embodiment, the die bonding area 40 is formed as a recess; however, the die bonding area 40 is not limited to be formed as a recess, and may be any other form.

The light-emitting element 300 is as described above, and thus is not to be described again. The first electrode 3061 and the second electrode 3062 of the electrode unit 306 of the light-emitting element 300 are located in the die bonding area 40 of the package frame 201.

The electrode set 30 extends into the package frame 201 so as to be partially embedded in the package frame 201, and is partially located in the die bonding area 40 of the package frame 201. The electrode set 30 includes two spaced-apart electrode layers 202, and the electrode layers 202 are connected to the first electrode 3061 and the second electrode 3062 of the electrode unit 306, respectively.

The encapsulating layer 400 covers the light-emitting element 300 and fills the die bonding area 40 of the package frame 201.

Referring to FIGS. 10 to 13, a method for manufacturing the light-emitting device 200 includes steps S100 to S800.

In step S100, the substrate 301, which includes the first surface and the second surface opposite to the first surface, is provided. The substrate 301 may be any suitable substrate for allowing the epitaxial structure 20 to be formed thereon. In this embodiment, the substrate 301 is a sapphire substrate that is suitable for allowing a GaN type epitaxial structure to be formed thereon.

Figure 11:
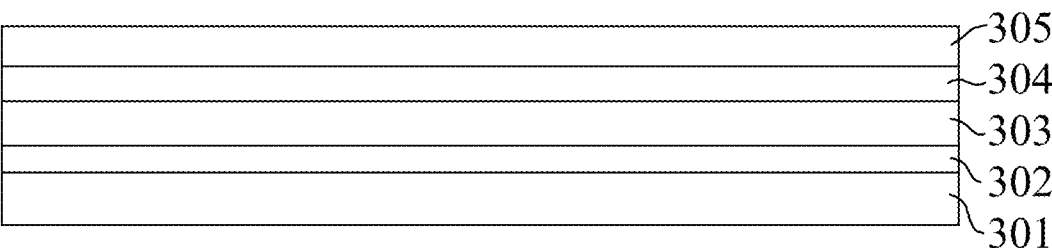
FIG. 11 is a schematic cross-sectional view illustrating an intermediate step in the method for manufacturing the light-emitting device according to the present disclosure.

Referring to FIG. 11, in step S200, the buffer layer 302, the first semiconductor layer 303, the quantum well layer 304, and the second semiconductor layer 305 are successively formed on the first surface of the substrate 301, thus obtaining a first laminate structure. It should be noted that the buffer layer 302 may be omitted. In this embodiment, the first semiconductor layer 303 is an n-type GaN layer, and the second semiconductor layer 305 is a p-type GaN layer.

Figure 12:
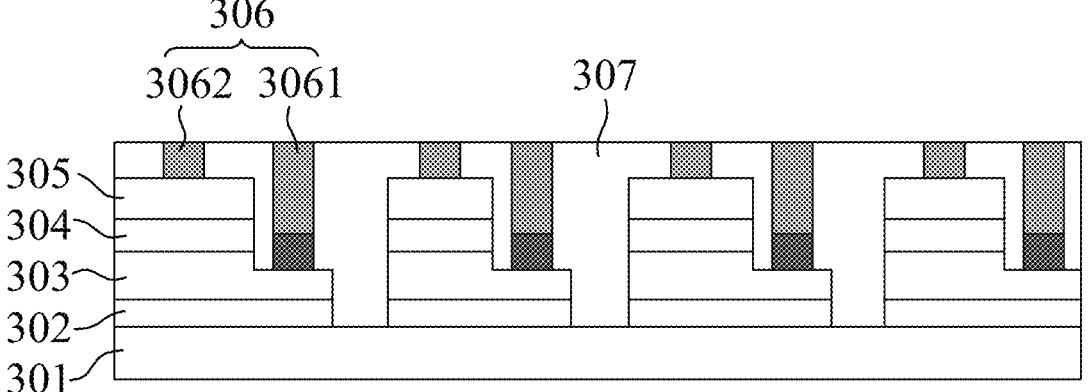
FIG. 12 is a schematic cross-sectional view illustrating an intermediate step in the method for manufacturing the light-emitting device according to the present disclosure.

Referring to FIG. 12, in step S300, the first laminate structure is etched from the second semiconductor layer 305 toward the substrate 301 so as to expose a part of the first semiconductor layer 303 and a part of the substrate 301, and so as to form a plurality of mesa structures that are spaced apart from each other. Each of the mesa structures includes a first surface that is an exposed surface of the first semiconductor layer 303, and a second surface that is an exposed surface of the second semiconductor layer 305. Then, a first electrode 3061 and a second electrode 3062 are formed on the first surface and the second surface of each of the mesa structures, respectively, so as to form the electrode unit 306.

Figure 13:
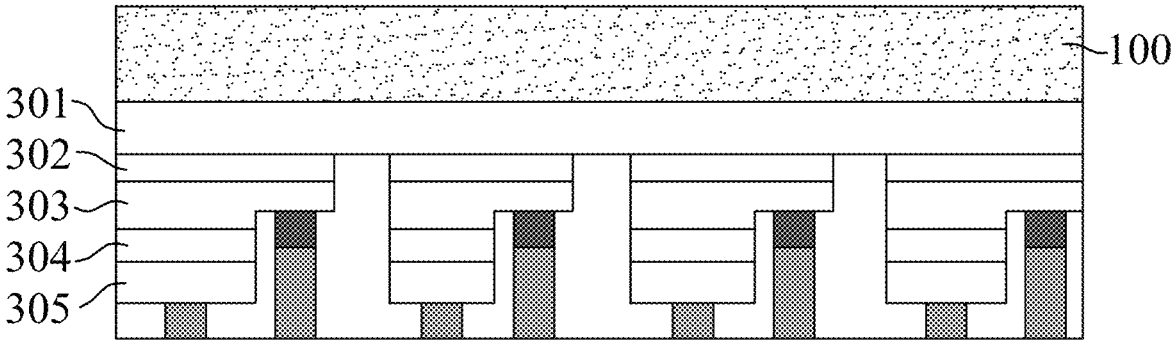
FIG. 13 is a schematic cross-sectional view illustrating an intermediate step in the method for manufacturing the light-emitting device according to the present disclosure.

Referring to FIG. 13, in step S400, the above-mentioned DBR 100 is formed on the second surface of the substrate 301, thus obtaining a second laminate structure, in which the first reflective unit 101 of the DBR 100 is disposed on the second surface of the substrate 301.

Referring to FIGS. 13 and 8, in step S500, the exposed part of the substrate 301 of the second laminate structure is subjected to a cutting process, thus obtaining a plurality of light-emitting elements 300.

In step S600, the aforesaid package frame 201 defining the die bonding area 40 (see FIG. 9) is provided.

In step S700, one of the light-emitting elements 300 is mounted on the die bonding area 40 of the package frame 201 (see FIG. 9). The first electrode 3061 and the second electrode 3062 of the electrode unit 306 of the light-emitting element 300 are respectively connected to the electrode layers 202 of the package frame 201.

In step S800, the die bonding area 40 is filled with an encapsulating material so as to cover the light-emitting element 300, thus forming an encapsulating layer 400 (see FIG. 9). The encapsulating layer 400 has a refractive index that differs from that of the DBR 100 of the light-emitting element 300. The encapsulating material may be silicon, which has a refractive index ranging from about 1.41 to about 1.53.

A display panel according to an embodiment of the present disclosure includes at least one of the aforementioned light-emitting devices 200 and a control unit. The display panel may be a liquid crystal display panel. The at least one light-emitting device 200 serves as a backlight for the display panel. The control unit is used for controlling operations of the at least one light-emitting device 200.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising a light-emitting element that includes an epitaxial structure disposed on a first surface of a substrate, and a distributed Bragg reflector (DBR); wherein said DBR of said light-emitting element includes:

a first reflective unit that includes a plurality of first reflective structures stacked on one another, each of said first reflective structures having a first material layer and a second material layer, said first material layers and said second material layers of said first reflective structures being alternately stacked on one another; and a second reflective unit that is disposed on said first reflective unit and that includes a plurality of second reflective structures stacked on one another, each of said second reflective structures having a first material layer and a second material layer, said first material layers and said second material layers of said second reflective structures being alternately stacked on one another;

said first material layer of each of said first reflective structures has an optical thickness that differs from that of said first material layer of each of said second reflective structures;

said second material layer of each of said first reflective structures has an optical thickness that differs from that of said second material layer of each of said second reflective structures;

said first material layer of each of said first reflective structures and said second reflective structures has a refractive index that differs from that of said second material layer of each of said first reflective structures and said second reflective structures; and a greatest difference among differences in the optical thicknesses of said first material layers of said first reflective unit and differences in the optical thicknesses of said second material layers of said first reflective unit is less than a largest difference among differences in the optical thicknesses of said first material layers of said second reflective unit and differences in the optical thicknesses of said second material layers of said second reflective unit.

2. The light-emitting device as claimed in claim 1, wherein, in said first reflective structures and said second reflective structures, each of said first material layers and said second material layers has an optical thickness greater than $\lambda_0/4$, where 420 nm$\leq\lambda_0\leq$470 nm.

3. The light-emitting device as claimed in claim 1, wherein, in said first reflective structures, each of said first material layers and said second material layers has an optical thickness equal to $\lambda_1/4$, where $\lambda_1\leq$550 nm.

4. The light-emitting device as claimed in claim 1, wherein, in said second reflective structures, each of said first material layers has an optical thickness substantially equal to $\lambda_2/4$, where $\lambda_2\leq$900 nm, and each of said second material layers has an optical thickness substantially equal to $\lambda_3/4$, where $\lambda_3\leq$700 nm.

5. The light-emitting device as claimed in claim 1, wherein the quantity of each of said first reflective structures and said second reflective structures ranges between 6 and 19.

6. The light-emitting device as claimed in claim 1, wherein, in said first reflective structures and said second reflective structures, each of said first material layers has a refractive index less than that of each of said second material layers.

7. The light-emitting device as claimed in claim 6, wherein said DBR of said light-emitting element further includes a third material layer that is disposed on said first reflective unit opposite to said second reflective unit.

8. The light-emitting device as claimed in claim 1, wherein said DBR of said light-emitting element further includes a third reflective unit that is disposed on said second reflective unit opposite to said first reflective unit and that includes a plurality of third reflective structures stacked on one another, each of said third reflective structures having a first material layer and a second material layer that are stacked on one another, said second material layer of each of said third reflective structures having an oxygen content less than that of said second material layer of each of said first reflective structures and said second reflective structures.

9. The light-emitting device as claimed in claim 8, wherein said second material layer of each of said first reflective structures and said second reflective structures includes a TiO$_2$ layer; said second material layer of each of said third reflective structures includes a TiO$_n$ layer, where n ranges between 1.7 and 1.95.

10. The light-emitting device as claimed in claim 1, wherein said first reflective unit includes at least three of said first reflective structures, and the variation in the optical thickness among said first material layers of said first reflective structures is within 30 nm.

11. The light-emitting device as claimed in claim 1, wherein said first reflective unit includes at least three of said first reflective structures, and the variation in the optical thickness among said second material layers of said first reflective structures is within 30 nm.

12. The light-emitting device as claimed in claim 1, wherein said second reflective unit includes at least three of said second reflective structures, and said first material layer of one of said second reflective structures has an optical thickness no greater than 135 nm, and said first material layer of one of said second reflective structures has an optical thickness no smaller than 175 nm.

13. The light-emitting device as claimed in claim 1, wherein said second reflective unit includes at least three of said second reflective structures, and, in said second reflective unit, a difference in the optical thickness between one of said first material layers having a greatest optical thickness and one of said first material layers having the least optical thickness is no smaller than 60 nm.

14. The light-emitting device as claimed in claim 1, wherein said second reflective unit includes at least three of said second reflective structures, and, in said second reflective unit, a difference in the optical thickness between one of said second material layers having a greatest optical thickness and one of said second material layers having the least optical thickness is no smaller than 30 nm.

15. The light-emitting device as claimed in claim 1, wherein said first material layer of each of said first reflective structures and said second reflective structures has a refractive index less than that of said second material layer of each of said first reflective structures and said second reflective structures, and, in said second reflective unit, the sum of the optical thicknesses of said first material layers is greater than the sum of the optical thicknesses of said second material layers.

16. The light-emitting device as claimed in claim 7, wherein said third material layer of said DBR of said light-emitting element is disposed between said first reflective unit and said substrate.

17. A display panel, comprising a light-emitting device as claimed in claim 1.

18. A light-emitting device, comprising a light-emitting element that includes an epitaxial structure disposed on a first surface of a substrate, and a distributed Bragg reflector (DBR); wherein said DBR of said light-emitting element includes:

a first reflective unit that includes a plurality of first reflective structures stacked on one another, each of said first reflective structures having a first material layer and a second material layer, said first material layers and said second material layers of said first reflective structures being alternately stacked on one another; and a second reflective unit that is disposed on said first reflective unit and that includes a plurality of second reflective structures stacked on one another, each of said second reflective structures having a first material layer and a second material layer, said first material layers and said second material layers of said second reflective structures being alternately stacked on one another;

said first material layer of each of said first reflective structures has an optical thickness that differs from that of said first material layer of each of said second reflective structures;

said second material layer of each of said first reflective structures has an optical thickness that differs from that of said second material layer of each of said second reflective structures;

said first material layer of each of said first reflective structures and said second reflective structures has a refractive index that differs from that of said second material layer of each of said first reflective structures and said second reflective structures;

said DBR of said light-emitting element further includes a third reflective unit that is disposed on said second reflective unit opposite to said first reflective unit and that includes a plurality of third reflective structures stacked on one another, each of said third reflective structures having a first material layer and a second material layer that are stacked on one another, said second material layer of each of said third reflective structures having an oxygen content less than that of said second material layer of each of said first reflective structures and said second reflective structures; and said second material layer of each of said first reflective structures and said second reflective structures includes a TiO$_2$ layer; said second material layer of each of said third reflective structures includes a TiO$_n$ layer, where n ranges between 1.7 and 1.95.

19. A light-emitting device, comprising a light-emitting element that includes an epitaxial structure disposed on a first surface of a substrate, and a distributed Bragg reflector (DBR); wherein said DBR of said light-emitting element includes:

a first reflective unit that includes a plurality of first reflective structures stacked on one another, each of said first reflective structures having a first material layer and a second material layer, said first material layers and said second material layers of said first reflective structures being alternately stacked on one another; and a second reflective unit that is disposed on said first reflective unit and that includes a plurality of second reflective structures stacked on one another, each of said second reflective structures having a first material layer and a second material layer, said first material layers and said second material layers of said second reflective structures being alternately stacked on one another;

said first material layer of each of said first reflective structures has an optical thickness that differs from that of said first material layer of each of said second reflective structures;

said second material layer of each of said first reflective structures has an optical thickness that differs from that of said second material layer of each of said second reflective structures;

said first material layer of each of said first reflective structures and said second reflective structures has a refractive index that differs from that of said second material layer of each of said first reflective structures and said second reflective structures; and said second reflective unit includes at least three of said second reflective structures, and, in said second reflective unit, a difference in the optical thickness between one of said first material layers having a greatest optical thickness and one of said first material layers having the least optical thickness is no smaller than 60 nm.

20. The light-emitting device as claimed in claim 19, wherein, in said first reflective structures and said second reflective structures, each of said first material layers and said second material layers has an optical thickness greater than $\lambda_0/4$, where 420 nm$\leq\lambda_0\leq$470 nm.

* * * * *